United States Patent
Gamo et al.

(10) Patent No.: US 10,454,020 B2
(45) Date of Patent: Oct. 22, 2019

(54) CRYSTAL VIBRATOR, METHOD FOR MANUFACTURING THE SAME, AND CRYSTAL VIBRATION DEVICE

(71) Applicant: Murata Manufacturing Co., Ltd., Nagaokakyo-shi, Kyoto-fu (JP)

(72) Inventors: Masao Gamo, Nagaokakyo (JP); Kazuyuki Noto, Nagaokakyo (JP); Keiichi Kami, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 357 days.

(21) Appl. No.: 15/498,650

(22) Filed: Apr. 27, 2017

(65) Prior Publication Data

US 2017/0229638 A1 Aug. 10, 2017

Related U.S. Application Data

(63) Continuation of application No. PCT/JP2016/050547, filed on Jan. 8, 2016.

(30) Foreign Application Priority Data

Jan. 28, 2015 (JP) .................................. 2015-014445

(51) Int. Cl.
*H01L 41/09* (2006.01)
*H01L 41/332* (2013.01)
(Continued)

(52) U.S. Cl.
CPC ........ *H01L 41/332* (2013.01); *H01L 41/0475* (2013.01); *H01L 41/0993* (2013.01);
(Continued)

(58) Field of Classification Search
CPC ............... H01L 41/332; H01L 41/0475; H01L 41/0993; G03H 3/02; H03H 9/1021;
(Continued)

(56) References Cited

U.S. PATENT DOCUMENTS 2,486,916 A * 11/1949 Bottom .................... H03H 9/19
310/369
RE26,707 E * 11/1969 Cutler et al. ......... H03H 9/0595
310/346
(Continued)

FOREIGN PATENT DOCUMENTS

JP 58141022 A * 8/1983 ............... H03H 9/19
JP H06-52230 U 7/1994
(Continued)

OTHER PUBLICATIONS

International Search Report issued in International Application No. PCT/JP2016/050547, dated Mar. 15, 2016.
(Continued)

*Primary Examiner* — Thomas M Dougherty
(74) *Attorney, Agent, or Firm* — Arent Fox LLP (57) ABSTRACT

A crystal vibrator that includes a crystal substrate having a front surface and a rear surface, including a vibration portion in a region including a center of the crystal substrate, and a first peripheral portion that surrounds a periphery of the vibration portion and that has a smaller thickness than the vibration portion. Drive electrodes are formed on both surfaces of the vibration portion of the crystal substrate. In at least one of the front surface and the rear surface of the crystal substrate, a step is provided between the vibration portion and the first peripheral portion, and a first peripheral edge portion of the vibration portion and a second peripheral edge portion of the first peripheral portion are in a curved surface shape.

9 Claims, 4 Drawing Sheets

(51) Int. Cl.
*H03H 3/02* (2006.01)
*H03H 9/19* (2006.01)
*H01L 41/047* (2006.01)
*H03H 9/10* (2006.01)
*H03H 9/17* (2006.01)

(52) U.S. Cl.
CPC ............ *H03H 3/02* (2013.01); *H03H 9/1021* (2013.01); *H03H 9/177* (2013.01); *H03H 9/19* (2013.01); *H03H 2003/022* (2013.01); *H03H 2003/028* (2013.01)

(58) Field of Classification Search
CPC .... H03H 9/177; H03H 9/19; H03H 2003/022; H03H 2003/028
USPC ............ 310/348–354, 367–369, 371
See application file for complete search history.

(56) References Cited

U.S. PATENT DOCUMENTS

| | | | | |
|---|---|---|---|---|
| 4,135,108 A | * | 1/1979 | Besson | H03H 9/1014 310/344 |
| 4,476,411 A | * | 10/1984 | Okazaki | H03H 9/02023 310/348 |
| 4,558,248 A | * | 12/1985 | Valentin | H03H 9/19 310/315 |
| 4,720,651 A | * | 1/1988 | Nakazawa | H03H 9/19 310/335 |

FOREIGN PATENT DOCUMENTS

| | | |
|---|---|---|
| JP | 2007-53820 A | 3/2007 |
| JP | 2011-205516 A | 10/2011 |
| JP | 2012-199606 A | 10/2012 |
| JP | 2014-143588 A | 8/2014 |

OTHER PUBLICATIONS

Written Opinion of the International Searching Authority issued in International Application No. PCT/JP2016/050547, dated Mar. 15, 2016.

\* cited by examiner

CRYSTAL VIBRATOR, METHOD FOR MANUFACTURING THE SAME, AND CRYSTAL VIBRATION DEVICE

CROSS REFERENCE TO RELATED APPLICATIONS

The present application is a continuation of International application No. PCT/JP2016/050547, filed Jan. 8, 2016, which claims priority to Japanese Patent Application No. 2015-014445, filed Jan. 28, 2015, the entire contents of each of which are incorporated herein by reference.

FIELD OF THE INVENTION

The present invention relates to a crystal vibrator, a method for manufacturing the same, and a crystal vibration device.

BACKGROUND OF THE INVENTION

As a piezoelectric vibrator used in oscillation devices, bandpass filters, and the like, a crystal vibrator that uses thickness shear vibration is widely used. As such a crystal vibrator, for example, a crystal vibrator having a mesa-structure is known in which, in order to confine the vibration energy of thickness shear vibration, an etching process is performed so as to make a center portion of the crystal vibrator thicker than a peripheral portion of the crystal vibrator and drive electrodes are formed on both main surfaces of the center portion (Patent Document 1). Accordingly, because it is possible to concentrate more vibration energy directly under the drive electrodes, it is possible to make the crystal impedance value (CI value) lower than that of a crystal vibrator having a simple flat shape and to improve the electrical characteristics.

However, in the existing mesa-structure, there have been cases where vibration energy that occurs at the vibration portion and vibration energy of unnecessary vibration that occurs by reflection of vibration at an end surface of an outer peripheral portion at the periphery of the vibration portion become mixed and the characteristics of the crystal vibrator deteriorate. Moreover, reflection of vibration may occur at an end surface or corner where the thickness changes between a region of the center portion and the peripheral portion, and there is a possibility of spurious vibration, which is unnecessary vibration, increasing. Moreover, extending electrodes that extend from the drive electrodes may become disconnected in the vicinity of a corner of a step portion formed at the boundary between the center portion and the peripheral portion. In addition, stress concentrates in the vicinity of the corner of the step portion and, for example, there is a possibility of cracks occurring at the time of mounting the crystal vibrator or the like.

Patent Document 1: Japanese Unexamined Patent Application Publication No. 2007-53820

SUMMARY OF THE INVENTION

The present invention is made in consideration of such a situation and the object thereof is to improve the vibration energy confinement characteristics.

A crystal vibrator according to an aspect of the invention uses thickness shear vibration as a main vibration. The crystal vibrator includes a crystal substrate having a front surface and a rear surface, including a vibration portion that is provided in a region including a center of the crystal substrate, and including a first peripheral portion that is arranged so as to surround a periphery of the vibration portion and that has a smaller thickness than the vibration portion. Drive electrodes that are formed on both surfaces of the vibration portion of the crystal substrate. In at least one of the front surface and the rear surface of the crystal substrate, a step is provided between the vibration portion and the first peripheral portion, and a peripheral edge portion of the vibration portion and a peripheral edge portion of the first peripheral portion are chamfered and formed in a curved surface shape.

In the above-described configuration, because a peripheral edge portion of a vibration portion and a peripheral edge portion of a first peripheral portion are formed in a curved surface shape, it is possible to make the crystal impedance value lower than that of a structure having a simple flat shape or an existing mesa-type crystal vibrator. Moreover, because each corner of each peripheral edge portion is chamfered, reflection of vibration is suppressed and it is possible to decrease spurious vibration. In this way, it is possible to provide a crystal vibrator with high vibration energy confinement characteristics. Moreover, it is possible to prevent concentration of stress in the vicinity of corners, and it is possible to have durability against mechanical shocks of the crystal vibrator at the time of mounting or the like and to improve mechanical strength for crack prevention or the like.

In the above-described crystal vibrator, the crystal substrate further includes a second peripheral portion that is arranged so as to surround the first peripheral portion and that has a smaller thickness than the first peripheral portion. In at least one of the front surface and the rear surface of the crystal substrate, steps are provided between the vibration portion and the first peripheral portion, and between the first peripheral portion and the second peripheral portion, and the peripheral edge portion of the vibration portion, the peripheral edge portion of the first peripheral portion and a peripheral edge portion of the second peripheral portion are chamfered and formed in a curved surface shape.

In the above-described crystal vibrator, it is possible to provide the second peripheral portion on an outermost periphery of the crystal substrate.

In the above-described crystal vibrator, it is possible to form a peripheral edge portion of the vibration portion, the peripheral edge portion of the first peripheral portion and the peripheral edge portion of the second peripheral portion so as to be shaped as an enveloping surface.

Accordingly, because each peripheral edge portion is formed into a curved surface making in total one enveloping surface, it is possible to further decrease the crystal impedance value and spurious vibration and it is possible to further improve the vibration energy confinement characteristics.

In the above-described crystal vibrator, it is possible to form the enveloping surface in a substantially oval shape.

In the above-described crystal vibrator, it is possible to form a portion of the enveloping surface in a substantially spherical shape.

In the above-described crystal vibrator, extending electrodes that are electrically connected to the drive electrodes are further included, and it is possible to form each of the extending electrodes so as to pass over at least the peripheral edge portion of the vibration portion and the peripheral edge portion of the first peripheral portion.

Accordingly, because each of the above-described peripheral edge portions is formed in a curved surface shape, even in the case where the electrodes are formed so as to pass over the peripheral edge portions, it is possible to prevent disconnection of the electrodes in the vicinity of the corners of the step portions.

The crystal vibration device according to an aspect of the present invention includes a base member, a lid member connected to the base member so as to form a sealed interior space, and the above-described crystal vibrator housed in the interior space.

According to the above-described configuration, because a crystal vibrator including the above-described crystal substrate structure is provided, it is possible to increase the vibration energy confinement characteristics and improve mechanical strength.

A method for manufacturing a crystal vibrator according to an aspect of the present invention includes forming a step between a vibration portion and a first peripheral portion on at least one of a front surface and a rear surface of a crystal substrate by etching the crystal substrate so as to define the vibration portion in a region including a center of the crystal substrate, the first peripheral portion surrounding a periphery of the vibration portion and having a smaller thickness than the vibration portion. A peripheral edge portion of the vibration portion and a peripheral edge portion of the first peripheral portion is formed in a curved surface shape by polishing the crystal substrate. Dive electrodes are formed on both surfaces of the vibration portion of the crystal substrate.

According to the above-described configuration, because a peripheral edge portion of a vibration portion and a peripheral edge portion of a first peripheral portion are formed in a curved surface shape, it is possible to manufacture a crystal vibrator with a crystal impedance value lower than that of a structure having a simple flat shape or an existing mesa-type crystal vibrator. Moreover, because each corner of each peripheral edge portion is chamfered, reflection of vibration is suppressed and it is possible to decrease spurious vibration. In this way, it is possible to realize a method for manufacturing a crystal vibrator with high vibration energy confinement characteristics. Moreover, it is possible to prevent concentration of stress in the vicinity of corners, and it is possible to have durability against mechanical shocks of the crystal vibrator at the time of mounting or the like and to improve mechanical strength for crack prevention or the like.

According to the present invention, it is possible to improve the vibration energy confinement characteristics by decreasing the crystal impedance value and decreasing spurious vibration. Moreover, it is possible to improve mechanical strength for crack prevention or the like.

DETAILED DESCRIPTION OF PREFERRED EMBODIMENTS

An embodiment of the present invention is described below. In the descriptions of the drawings below, identical or similar components are denoted by identical or similar reference signs. The drawings are examples, and the dimensions and shapes of parts are schematic and are understood as not limiting the technical scope of the present invention to any specific embodiment.

Figure 1:
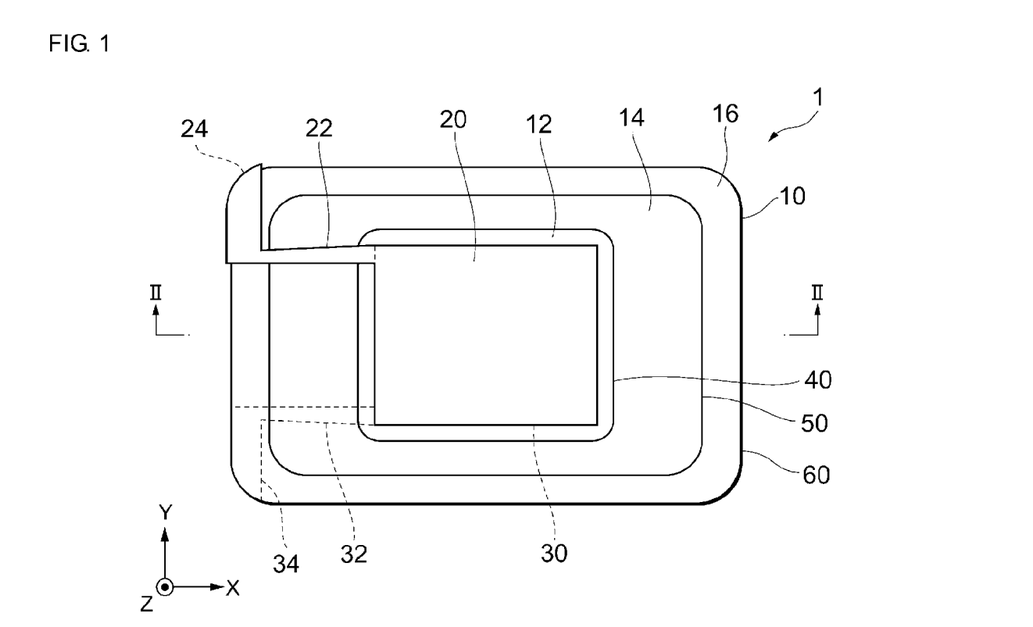
FIG. 1 is a plan view for explaining a crystal vibrator according to a present embodiment.
Figure 2:
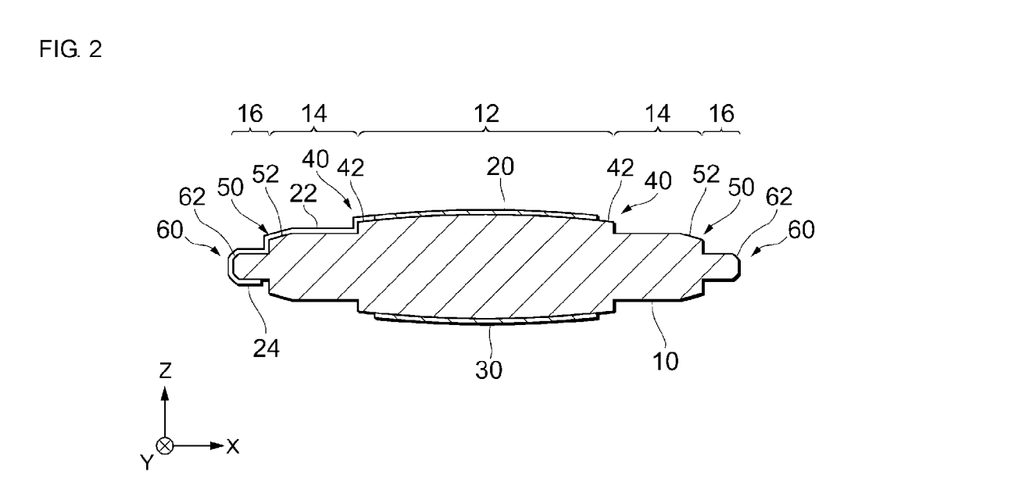
FIG. 2 is a sectional view of line II-II of FIG. 1.
Figure 3:
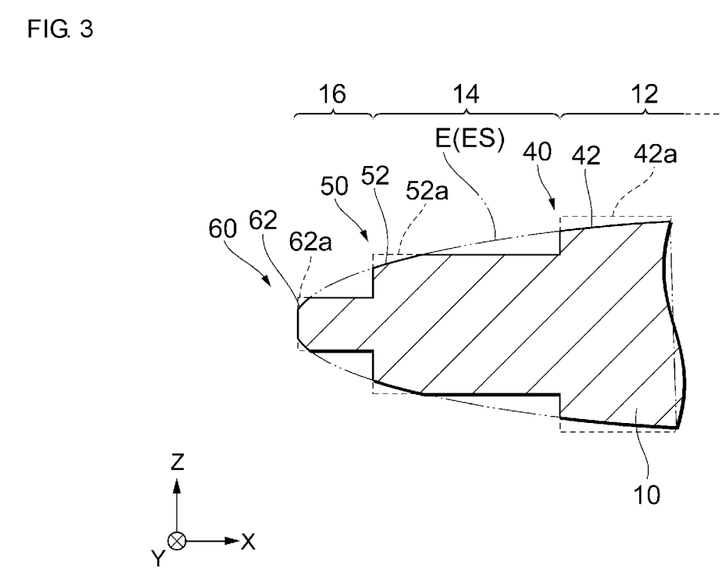
FIG. 3 is an enlarged sectional view of a portion of the crystal vibrator according to the present embodiment.
Figure 4:
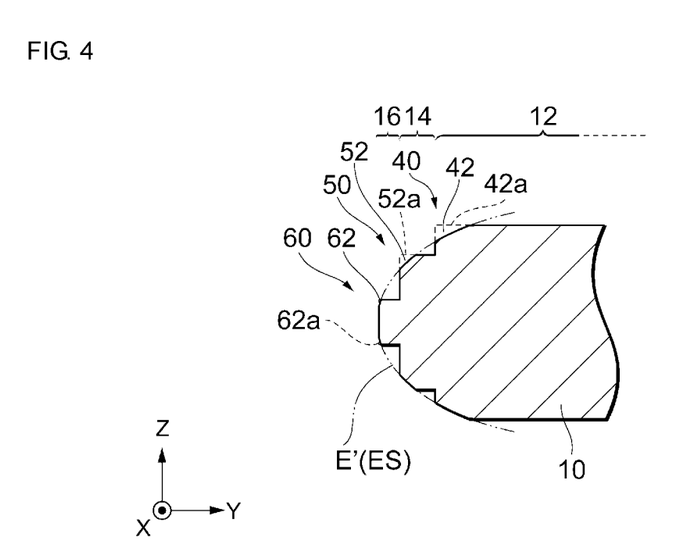
FIG. 4 is an enlarged sectional view of a portion of the crystal vibrator according to the present embodiment.

FIG. 1 is a plan view of a crystal vibrator according to a first embodiment and FIG. 2 is a sectional view of line II-II of FIG. 1. Moreover, FIG. 3 and FIG. 4 are sectional views of respective portions of the crystal vibrator; FIG. 3 being a sectional view of the XZ plane and FIG. 4 being a sectional view of the YZ plane. Further, in FIG. 3 and FIG. 4, electrodes are omitted.

A crystal vibrator 1 according to this embodiment includes a crystal substrate 10 that has a front surface and a rear surface, and a pair of first and second drive electrodes 20 and 30 formed on the crystal substrate 10.

The crystal substrate 10 is, for example, composed of a crystal formed with an AT cut. In the examples illustrated in FIG. 1 and FIG. 2, the crystal substrate 10 has a substantially rectangular external shape that has a long-side direction parallel to the X direction, a short-side direction parallel to the Y direction and a symmetrical shape in the Z direction with respect to the XY plane. Further, the crystal substrate 10 is not particularly limited to such an external rectangular shape and may be formed with a cut different from the AT cut.

The crystal substrate 10 has a vibration portion 12 that is formed so as to perform thickness shear vibration, and first and second peripheral portions 14 and 16 are provided on the periphery of the vibration portion 12. Specifically, as illustrated in FIG. 1, the crystal substrate 10 includes the vibration portion 12 that is provided in a region including a substantially center portion of the crystal substrate 10, the first peripheral portion 14 that is provided so as to surround the whole periphery of the vibration portion 12 and the second peripheral portion 16 that is provided so as to surround the whole periphery of the first peripheral portion 14. Further, in an example in this embodiment, an outermost periphery 60 of the second peripheral portion 16 is equivalent to the outermost periphery of the crystal substrate 10 in the XY plane.

As illustrated in FIG. 2, the vibration portion 12 is formed so as to have the largest thickness (width in the Z direction) in the crystal substrate 10, the first peripheral portion 14 is formed so as to be thinner than the vibration portion 12, and the second peripheral portion 16 is formed so as to be thinner than the first peripheral portion 14. In other words, a first step portion 40 and a second step portion 50 are formed in this order from the center toward the outer periphery of the crystal substrate 10 on the front surface and rear surface thereof. In this embodiment, a peripheral edge portion 42 of the vibration portion 12, a peripheral edge portion 52 of the first peripheral portion 14, and a peripheral edge portion 62 of the second peripheral portion 16 are all formed in a curved surface shape. This point will be touched upon later.

In the front surface of the crystal substrate 10, the first drive electrode 20 is formed on a main surface of the vibration portion 12. The first drive electrode 20 is formed so as to have substantially the same size as the main surface of the vibration portion 12. Moreover, on the front surface of the crystal substrate 10, an extending electrode 22 is formed so as to be electrically connected to the first drive electrode 20 and so as to extend in a direction toward the outermost periphery 60 of the crystal substrate 10. The extending electrode 22 passes over an end portion of the outermost periphery 60 of the crystal substrate 10 and is electrically connected to a connection electrode 24 that is formed on the rear surface (the second peripheral portion 16) of the crystal substrate 10. That is, the extending electrode 22 is formed so as to pass over the peripheral edge portion 42 of the vibration portion 12, the peripheral edge portion 52 of the first peripheral portion 14, and the peripheral edge portion 62 of the second peripheral portion 16.

In contrast, on the rear surface of the crystal substrate 10, the second drive electrode 30 is formed on the main surface of the vibration portion 12. The second drive electrode 30 is formed so as to have substantially the same size as the main surface of the vibration portion 12. Moreover, on the rear surface of the crystal substrate 10, an extending electrode 32 is formed so as to be electrically connected to the second drive electrode 30 and so as to extend in a direction toward the outermost periphery 60 of the crystal substrate 10. The extending electrode 32 is electrically connected to a connection electrode 34 that is formed on the rear surface (the second peripheral portion 16) of the crystal substrate 10. That is, the extending electrode 32 is formed so as to pass over the peripheral edge portion 42 of the vibration portion 12 and the peripheral edge portion 52 of the first peripheral portion 14.

The above-described electrodes of the first and second drive electrodes 20 and 30 are not particularly limited and may be formed by, for example, forming a chrome (Cr) layer on a base and thereafter forming a gold (Au) layer on the front surface of the chrome layer. Moreover, in this embodiment, the connection electrodes 24 and 34 are arranged on either short side of the crystal substrate 10; however, they are not particularly limited to such an arrangement.

In this embodiment, as illustrated in FIG. 2, all of the peripheral edge portions 42, 52, and 62 are formed in a curved surface shape. Specifically, as illustrated in the partially enlarged diagram in FIG. 3, in the first step portion 40, the peripheral edge portion 42 is formed in a curved surface shape by chamfering a corner portion 42a of the vibration portion 12, and similarly in the second step portion 50, the peripheral edge portion 52 is formed in a curved surface shape by chamfering a corner portion 52a of the first peripheral portion 14. Further, similarly in the outermost periphery 60, the peripheral edge portion 62 is formed in a curved surface shape by chamfering a corner portion 62a of the second peripheral portion 16.

The first and second step portions 40 and 50 may each have sidewall surfaces.

In the crystal substrate 10, the whole periphery of the peripheral edge portion 42 of the vibration portion 12, the whole periphery of the peripheral edge portion 52 of the first peripheral portion 14, and the whole periphery of the second peripheral portion 16 are all formed so as to have a curved surface shape. Moreover, the whole surface of the vibration portion 12 may be formed in a curved surface shape.

As illustrated in FIG. 3 and FIG. 4, all of the curved surfaces of the peripheral edge portions 42, 52, and 62 together form an envelope curve E in a sectional view of the XZ plane and it is preferable that they be formed so as to be an envelope curve E' in a sectional view of the YZ plane. For example, in the case where the sectional view of the XZ plane is the long-side direction of the crystal substrate 10 and the YZ plane is the short-side direction of the crystal substrate 10, the envelope curves E and E' may be different curves or curves having different curvatures or may be identical curves or curves having the same curvature. Because the peripheral edge portions 42, 52, and 62 are contiguous so as to go around a certain region on the XY plane of the crystal substrate 10, at least one portion of an enveloping surface ES formed of the curved surfaces of all of the peripheral edge portions is formed in a substantially oval shape or spherical shape. For example, as illustrated in this embodiment, in the crystal substrate 10 having a long-side direction and a short-side direction, an enveloping surface ES is formed in a substantially oval shape.

Moreover, the distance between the peripheral edge portion 42 of the vibration portion 12 and the peripheral edge portion 52 of the first peripheral portion 14, is preferably larger than the distance between the peripheral edge portion 52 of the first peripheral portion 14 and the peripheral edge portion 62 of the second peripheral portion 16. From this, it is possible to easily form the above-described enveloping surface ES.

According to the crystal vibrator 1 of this embodiment, because the peripheral edge portion 42 of the vibration portion 12, the peripheral edge portion 52 of the first peripheral portion 14, and the peripheral edge portion 62 of the second peripheral portion 16 are formed in a curved surface shape, it is possible to make the crystal impedance value lower than that of a structure having a simple flat shape or an existing mesa-type crystal vibrator. Moreover, because each corner of each of the peripheral edge portions 42, 52, and 62 is chamfered, reflection of vibration is suppressed and it is possible to decrease spurious vibration. In this way, it is possible to provide a crystal vibrator with high vibration energy confinement characteristics. Moreover, it is possible to prevent concentration of stress in the vicinity of corners, and it is possible to have durability against mechanical shocks of the crystal vibrator at the time of mounting or the like and to improve mechanical strength for crack prevention or the like.

Moreover, in the crystal vibrator 1 described above, because each of the peripheral edge portions 42, 52, and 62 is formed in a curved surface shape, it is possible to prevent disconnection of the extending electrode 22 that passes over the peripheral edge portions 42, 52, and 62 and the extending electrode 32 that passes over the peripheral edge portions 42 and 52 in the vicinity of the corners of the step portions.

Moreover, in the crystal vibrator 1 described above, because the corners of the step portions are chamfered, it is possible to prevent concentration of stress in the vicinity of corners, it is possible to have durability against mechanical shocks of the crystal vibrator at the time of mounting or the like and to improve mechanical strength for crack prevention or the like.

Moreover, in the crystal vibrator 1 described above, because the peripheral edge portions 42, 52, and 62 are formed so as to be an enveloping surface ES, it is possible to further decrease the crystal impedance value and spurious vibration and it is possible to further improve the vibration energy confinement characteristics.

Figure 5:
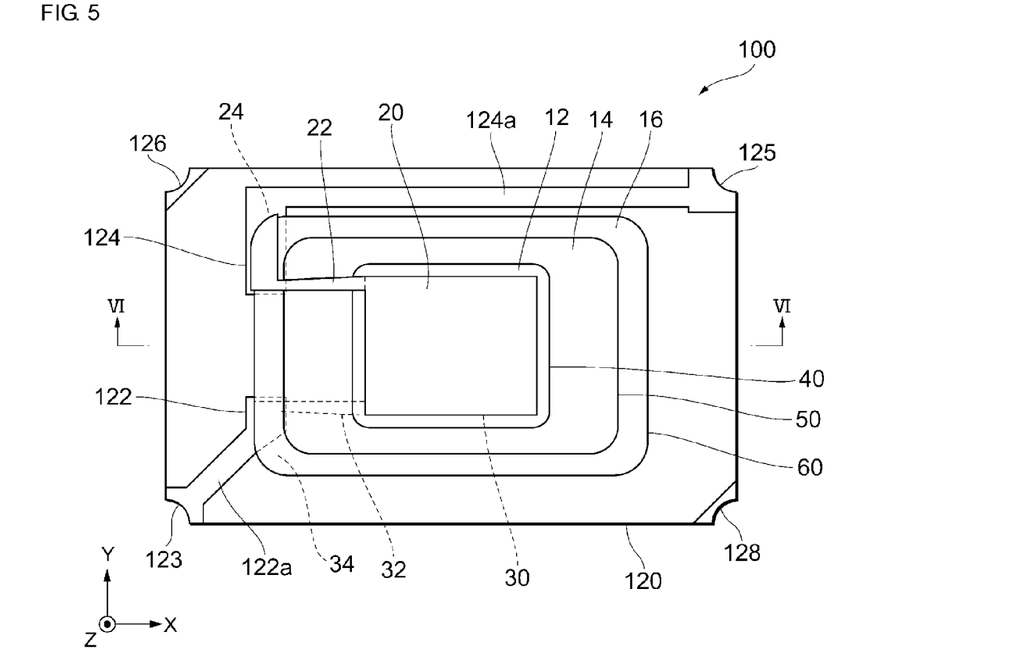
FIG. 5 is a plan view for explaining a crystal vibration device according to the present embodiment.
Figure 6:
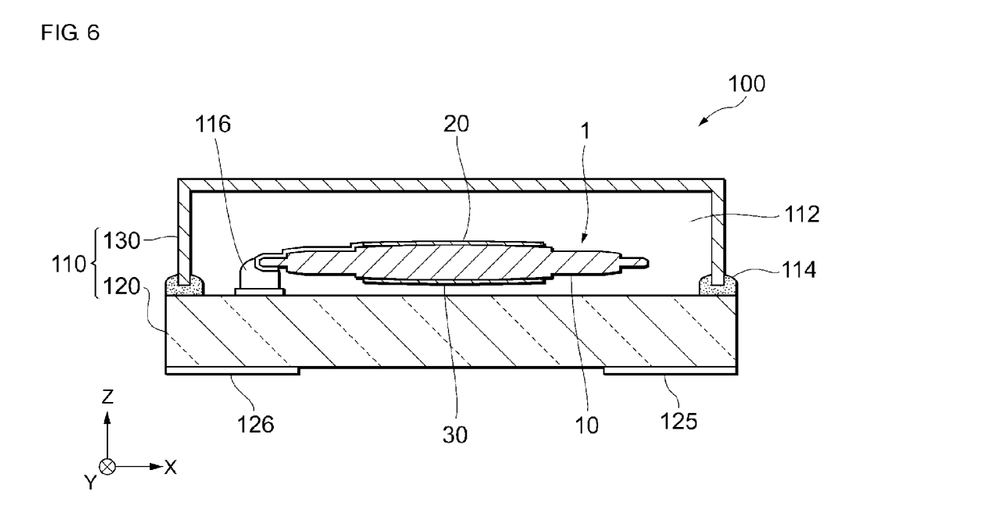
FIG. 6 is a sectional view of line VI-VI of FIG. 5.

Next, a crystal vibration device according incorporating the crystal vibrator 1 will be described with reference to FIG. 5 and FIG. 6. Here, FIG. 5 is a plan view of a crystal vibration device according to this embodiment, and FIG. 6 is a sectional view of line VI-VI of FIG. 5. Further, in FIG. 5, a lid member is omitted.

As illustrated in FIG. 5, a crystal vibration device 100 according to this embodiment includes the crystal vibrator 1 described above and a package member 110 in which the crystal vibrator 1 is housed.

The package member 110 has a base member 120 and a lid member 130. The crystal vibrator 1 is formed so as to be connected to the base member 120 and the lid member 130 and is housed in an interior space (cavity) 112 that is sealed. Specifically, the crystal vibrator 1 is housed and supported in the package member 110 (the base member 120 and the lid member 130) such that one end of the crystal vibrator 1 where the connection electrodes 24 and 34 are arranged becomes a fixed end and the other end of the crystal vibrator 1 becomes a free end. The base member 120 may be formed of an insulating ceramic such as alumina or may be formed of another insulating material such as a synthetic resin. Moreover, the lid member 130 may be formed of, for example, a metal, may be formed of an insulating material such as an insulating ceramic or a synthetic resin, or may be formed of a composite material composed of the aforementioned.

Electrodes 122 and 124 are formed on the upper surface of the base member 120 on which the crystal vibrator 1 is to be mounted. The electrodes 122 and 124 are electrically connected respectively to the connection electrodes 34 and 24 of the crystal vibrator 1 via an electrically conductive adhesive 116. The electrode 122 of the base member 120 is electrically connected to an outer electrode 123 that is provided on the rear surface of a corner portion of the base member 120 via an extending electrode 122a, in contrast, the electrode 124 of the base member 120 is electrically connected to an outer electrode 125 that is provided on a rear surface of another corner portion of the base member 120 via an extending electrode 124a. The outer electrodes 123 and 125 may be provided at positions that face each other in the XY plane of the crystal vibrator 1 (for example, as illustrated in FIG. 5, at diagonally opposite positions of the external form of the substantially rectangular shape). Moreover, in the example illustrated in FIG. 5, the outer electrodes 126 and 128 may be formed in corner portions other than the corner portions including the outer electrodes 123 and 125. The outer electrodes 126 and 128 may be grounded or may be dummy electrodes that are not electrically connected.

The lid member 130, as illustrated in FIG. 6, has an opening for forming the interior space 112. The lid member 130 is, for example, a cap, and the opening end portion of the lid member 130 may form the interior space 112, which is sealed by adhering the opening end portion of the lid member 130 to the outer peripheral end portion of the base member 120 by using an insulating adhesive 114. Alternatively, the method for connecting the base member 120 and the lid member 130 is not limited to use of a resin material such as an adhesive and, for example, weld sealing or glass sealing may be used.

Further, in the example illustrated in FIG. 6, a structure in which the lid member 130 has an opening for forming the interior space 112 is formed; however, as another example, a structure in which the base member 120 on which the outer electrodes are formed has an opening for forming the interior space 112 may be formed.

In the crystal vibration device 100, by applying AC voltage between the pair of the first and second drive electrodes 20 and 30 in the crystal vibrator 1 via the outer electrodes 123 and 125, a crystal vibrator 10 vibrates in the thickness shear mode and resonance characteristics can be obtained with the vibration.

In the crystal vibration device 100 according to this embodiment, because the crystal vibrator 1 described above is provided, it is possible to provide a crystal vibration device with high vibration energy confinement characteristics. Moreover, as described above, it is possible to provide a crystal vibration device in which disconnection of electrodes is prevented and that has improved mechanical strength.

Next, a method for manufacturing a crystal vibrator according to this embodiment will be described with reference to FIGS. 7A to 7D.

Figure 7A:
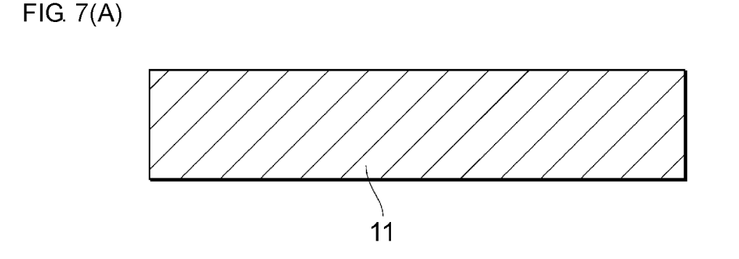
FIGS. 7A to 7D are diagrams for explaining the method for manufacturing the crystal vibrator according to the present embodiment.

Firstly, as illustrated in FIG. 7A, a crystal substrate 11 having a rectangular shape is prepared. The crystal substrate 11 may be formed by dicing a wafer into pieces.

Figure 7B:
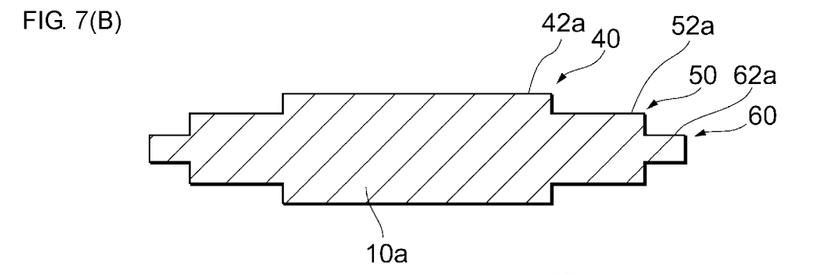

Next, as illustrated in FIG. 7B, a crystal substrate 10a is formed by certain processing including etching such as wet etching. Specifically, each of the corner portions 42a, 52a, and 62a are formed in the first and second step portions 40 and 50, and the outermost periphery 60 in the crystal substrate 10a. Further, the first and second step portions 40 and 50 of the crystal substrate 10a are formed on one or both of the front surface and the rear surface of the crystal substrate 10a.

Figure 7C:
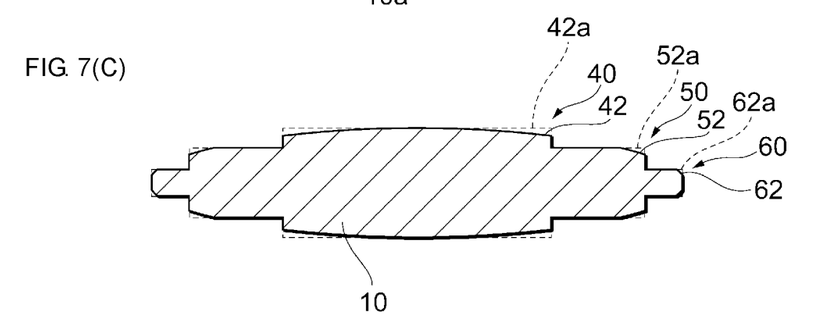

Next, as illustrated in FIG. 7C, each of the peripheral edge portions 42, 52, and 62 is formed in a curved surface shape by performing polishing on the crystal substrate 10a. Such polishing may be performed by, for example, barrel finishing. In barrel finishing, the crystal substrate 10a and an abrasive agent are inserted into a drum that has a certain interior space, and, by rotating the drum, it is possible to form the peripheral edge portions 42, 52, and 62 in a curved surface shape through friction of the abrasive agent and the interior wall surface. Accordingly, because the peripheral edge portions 42, 52, and 62 are formed in a shape that conforms to the interior wall surface of the drum, for example, it is possible to easily form a certain curved surface shape corresponding to the shape of the interior wall surface of the drum.

Figure 7D:
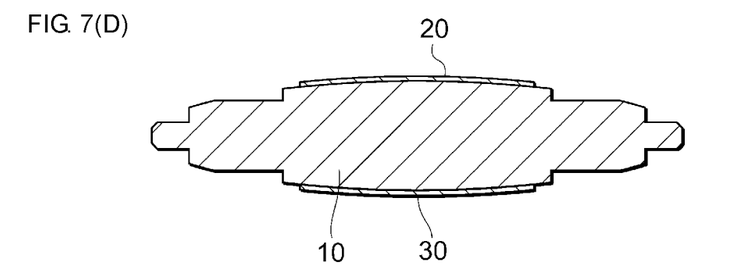

Thereafter, as illustrated in FIG. 7D, a pair of the first and second drive electrodes 20 and 30 is formed. The first and second drive electrodes 20 and 30 are, for example, formed by performing a sputtering method, an evaporation method or the like, and then performing etching so as to form a certain pattern. Alternatively, the first and second drive electrodes 20 and 30 may be formed by performing a sputtering method, an evaporation method or the like by using a mask having a certain pattern.

The present invention is not limited to the above-described embodiment and various modifications can be applied. For example, in the above-described embodiment, a case is described where the thickness changes in three steps, however; the thickness may change in two steps, or the thickness may change in four steps or more, and the structure described by the above embodiment may be applied to the peripheral edge portions provided in this way. Moreover, in the above-described embodiment, a case is described where steps are provided on both of the front surface and the rear surface of the crystal substrate; however, the present invention is not limited to this and the steps may be provided on one of the front surface and the rear surface of the crystal substrate.

Further, the embodiment described above is intended to facilitate understanding of the present invention and is not to be interpreted as limiting the present invention. The present invention can be modified or improved without deviating from the purpose, and the equivalents are included in this invention. In other words, appropriate design changes made to the embodiment by those skilled in the art are included in the scope of the invention as long as the features of the present invention are provided. For example, the elements and arrangement, materials, condition, shape, and size thereof included in the embodiment are not limited to those exemplified and can be modified appropriately. Moreover, the elements included in the embodiment may be combined as long as it is technically possible and are within the scope of the present invention as long as the combined elements include the features of the present invention.

REFERENCE SIGNS LIST

1 . . . crystal vibrator
10 . . . crystal substrate
12 . . . vibration portion
14 . . . first peripheral portion
16 . . . second peripheral portion
20 . . . first drive electrode
30 . . . second drive electrode
42 . . . peripheral edge portion
52 . . . peripheral edge portion
60 . . . outermost periphery
62 . . . peripheral edge portion
100 . . . crystal vibration device
112 . . . interior space
120 . . . base member
130 . . . lid member
ES . . . enveloping surface

The invention claimed is:

1. A crystal vibrator comprising:
a crystal substrate having:
  a front surface and a rear surface,
  a vibration portion in a region including a center of the crystal substrate, the vibration portion having a first periphery and a first peripheral edge portion having a curved surface shape,
  a first peripheral portion surrounding the first periphery of the vibration portion and having a smaller thickness than the vibration portion and a second peripheral edge portion having the curved surface shape, and
  a first step between the vibration portion and the first peripheral portion in at least one of the front surface and the rear surface of the crystal substrate;
a first drive electrode on the front surface of the vibration portion of the crystal substrate; and
a second drive electrode on the rear surface of the vibration portion of the crystal substrate.

2. The crystal vibrator according to claim 1, further comprising:
a second peripheral portion surrounding the first peripheral portion and having a smaller thickness than the first peripheral portion and a third peripheral edge portion having the curved surface shape; and
a second step between the first peripheral portion and the second peripheral portion.

3. The crystal vibrator according to claim 2, wherein the second peripheral portion defines an outermost periphery of the crystal substrate.

4. The crystal vibrator according to claim 3,
wherein the first peripheral edge portion of the vibration portion, the second peripheral edge portion of the first peripheral portion and the third peripheral edge portion of the second peripheral portion are shaped as an enveloping surface of the crystal substrate.

5. The crystal vibrator according to claim 4, wherein the enveloping surface is in an oval shape.

6. The crystal vibrator according to claim 4, wherein a portion of the enveloping surface is in a spherical shape.

7. The crystal vibrator according to claim 1, further comprising:
a first extending electrode electrically connected to the first drive electrode; and
a second extending electrode electrically connected to the second drive electrode.

8. The crystal vibrator according to claim 7, wherein each of the first and second extending electrodes pass over at least the first peripheral edge portion of the vibration portion and the second peripheral edge portion of the first peripheral portion.

9. A crystal vibration device comprising:
a base,
a lid connected to the base so as to define an interior space therebetween; and
the crystal vibrator according to claim 1 in the interior space.

* * * * *